(12) United States Patent
Komiyama et al.

(10) Patent No.: US 11,635,458 B2
(45) Date of Patent: Apr. 25, 2023

(54) ANALYZING APPARATUS, ANALYSIS METHOD, AND COMPUTER-READABLE MEDIUM

(71) Applicant: FUJI ELECTRIC CO., LTD., Kanagawa (JP)

(72) Inventors: Norihiro Komiyama, Matsumoto (JP); Masahiro Sasaki, Azumino (JP); Yuichi Onozawa, Matsumoto (JP); Shoji Yamada, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/700,521

(22) Filed: Mar. 22, 2022

(65) Prior Publication Data

US 2022/0334171 A1 Oct. 20, 2022

(30) Foreign Application Priority Data

Apr. 20, 2021 (JP) .............................. JP2021-071380

(51) Int. Cl.
*G01R 31/02* (2006.01)
*G01R 31/26* (2020.01)
(Continued)

(52) U.S. Cl.
CPC ..... *G01R 31/2642* (2013.01); *G01R 31/2637* (2013.01); *G01R 31/2805* (2013.01);
(Continued)

(58) Field of Classification Search
CPC ............ G01R 31/2642; G01R 31/2637; G01R 31/2805; G01R 31/2884; G01R 31/52;
(Continued)

(56) References Cited

U.S. PATENT DOCUMENTS 5,942,909 A 8/1999 Zhu
10,497,570 B2 12/2019 Kawase
(Continued)

FOREIGN PATENT DOCUMENTS

JP H0918010 A 1/1997
JP H10107107 A 4/1998
(Continued)

OTHER PUBLICATIONS

Takashi Masuhara et al.,"Development of an Accurate SPICE Model for a new 1,2-kV SiC-MOSFET device"(Example SPICE model of an iC-MOSFET), Proceedings of PCIM Europe digital days 2020,Jul. 7-8, 2020, pp. 407-410, 2020.

*Primary Examiner* — Raul J Rios Russo

(57) ABSTRACT

Provided is an analyzing apparatus including a charge amount analyzing unit configured to analyze, by using a device simulator configured to simulate a transient change of a charge in a semiconductor device having a first main terminal and a second main terminal, a change of a charge amount at any one of the terminals when a power source voltage applied between the first main terminal and the second main terminal is changed by a displacement voltage smaller than an initial voltage after a current flowing between the first main terminal and the second main terminal is stabilized with the semiconductor device being set to an ON state and the power source voltage being set to the initial voltage, and a capacitance calculating unit configured to compute a terminal capacitance at any one of the terminals based on the change of the charge amount analyzed by the charge amount analyzing unit.

20 Claims, 15 Drawing Sheets

(51) Int. Cl.
    *G01R 31/28*           (2006.01)
    *G01R 31/52*           (2020.01)
    *H01L 21/66*           (2006.01)

(52) U.S. Cl.
    CPC ......... *G01R 31/2884* (2013.01); *G01R 31/52* (2020.01); *H01L 22/34* (2013.01); *H01L 2924/00* (2013.01); *H01L 2924/0002* (2013.01)

(58) Field of Classification Search
    CPC ......... H01L 2924/00; H01L 2924/0002; H01L 22/34
    USPC .......... 324/71, 378, 403, 415, 425, 500, 537
    See application file for complete search history.

(56) References Cited

U.S. PATENT DOCUMENTS

| | | |
|---|---|---|
| 10,916,628 B2 | 2/2021 | Sakurai |
| 2011/0031981 A1* | 2/2011 | Tsujikawa .......... G01R 31/2623 |
| | | 324/554 |
| 2015/0051851 A1* | 2/2015 | Chen ................. G01R 31/2601 |
| | | 702/58 |
| 2015/0123165 A1 | 5/2015 | Omura |
| 2016/0254372 A1 | 9/2016 | Kawase |
| 2018/0188316 A1* | 7/2018 | Chen ................. G01R 31/2858 |

FOREIGN PATENT DOCUMENTS

| | | |
|---|---|---|
| JP | H11163312 A | 6/1999 |
| JP | 2019186312 A | 10/2019 |
| WO | 2013180186 A1 | 12/2013 |
| WO | 2015087439 A1 | 6/2015 |
| WO | 2016203545 A1 | 12/2016 |

\* cited by examiner

ANALYZING APPARATUS, ANALYSIS METHOD, AND COMPUTER-READABLE MEDIUM

The contents of the following Japanese patent application are incorporated herein by reference:
No. 2021-071380 filed in JP on Apr. 20, 2021

BACKGROUND

1. Technical Field

The present invention relates to an analyzing apparatus, an analysis method, and a computer-readable medium.

2. Related Art

Conventionally, a method of analyzing characteristics of a semiconductor device by using a circuit simulator or the like is known (see, for example, Patent Document 1).
Patent Document 1: Japanese Patent Application Publication No. 9-18010

DESCRIPTION OF EXEMPLARY EMBODIMENTS

Hereinafter, the present invention will be described through embodiments of the invention, but the following embodiments do not limit the invention according to the claims. In addition, not all of the combinations of features described in the embodiments are essential to the solving means of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor device is mounted.

In the present specification, a case where a term such as "same" or "equal" is mentioned may include a case where an error due to a variation in manufacturing or the like is included. The error is, for example, within 10%.

In the present specification, a conductivity type of doping region in which doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting conductivity type of the P type. In the present specification, the SI unit system is used. When a unit other than the SI unit system is used, computation may be performed by conversion into the SI unit system.

Figure 1:
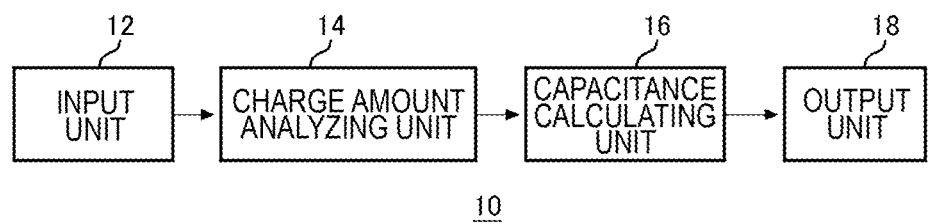
FIG. 1 is a diagram illustrating an example of an analyzing apparatus 10 according to an embodiment of the present invention.

FIG. 1 is a diagram illustrating an example of an analyzing apparatus 10 according to an embodiment of the present invention. The analyzing apparatus 10 analyzes characteristics of the semiconductor device. The semiconductor device includes a control terminal, a first main terminal, and a second main terminal. The semiconductor device is configured to control a main current flowing between the first main terminal and the second main terminal with a voltage applied by the control terminal. The semiconductor device may include a transistor element such as an insulated gate bipolar transistor (IGBT). The control terminal is, for example, a gate terminal or a base terminal of the transistor element. The first main terminal and the second main terminal are terminals through which the main current flows. The first main terminal is, for example, an emitter terminal or a source terminal of the transistor element. The second main terminal is, for example, a collector terminal or a drain terminal of the transistor element. The analyzing apparatus 10 analyzes a terminal capacitance at any one of the terminals of the semiconductor device. The terminal capacitance may be a parasitic capacitance of any one of the terminals. The terminal capacitance may be a parasitic capacitance between any two of the terminals.

The analyzing apparatus 10 may be an apparatus implemented by a computer. A program for causing the computer to function as the analyzing apparatus 10 may be given to the computer. The computer executes the program to perform the analysis method by the analyzing apparatus 10.

The analyzing apparatus 10 includes an input unit 12, a charge amount analyzing unit 14, a capacitance calculating unit 16, and an output unit 18. Data on the semiconductor device to be analyzed is input to the input unit 12. The data may be input by a user of the analyzing apparatus 10, or the like. The data may include information such as a position, a size, a shape, an impurity concentration, an electrical resistance, and a capacitance of each portion of the semiconductor device.

The charge amount analyzing unit 14 is configured to analyze a charge amount in a predetermined region in the semiconductor device under a predetermined analysis condition. The predetermined analysis condition may include a condition for specifying a control voltage to be applied to the control terminal and a power source voltage to be applied between the first main terminal and the second main terminal. The charge amount analyzing unit 14 is configured to analyze the charge of the semiconductor device with a device simulator capable of simulating a transient change of the charge amount in the semiconductor device. The transient change is, for example, a temporal change of the charge amount in the semiconductor device. The device simulator is configured to analyze a temporal change of the charge amount in the semiconductor device when the power source voltage is changed, for example. The device simulator may analyze the charge density in a predetermined region in the semiconductor device using, for example, Poisson's equation, and to calculate the charge amount in the region by integrating the charge density. The charge amount analyzing unit 14 may analyze the charge amount in the semiconductor device by using a known simulator.

The charge amount analyzing unit 14 is configured to set the semiconductor device to the ON state by setting the control voltage to a predetermined value, and to set the power source voltage applied between the first main terminal and the second main terminal to a predetermined initial voltage. Then, the charge amount analyzing unit 14 is configured to analyze, by using the device simulator, a change of the charge amount at any one of the terminals when the power source voltage is changed by a displacement voltage smaller than the initial voltage.

The capacitance calculating unit 16 is configured to compute the terminal capacitance at any one of the terminals based on the change of the charge amount analyzed by the charge amount analyzing unit 14. The capacitance calculating unit 16 may calculate the terminal capacitance based on the change of the charge amount with respect to the displacement voltage. Since a capacitance C is a value (C=Q/V) obtained by dividing a charge amount Q by a voltage V, the terminal capacitance can be calculated by dividing the amount of change in charge by the displacement voltage.

The output unit 18 is configured to output information on the terminal capacitance calculated by the capacitance calculating unit 16. The output unit 18 may display the information on the terminal capacitance on a display apparatus, may transmit the information to an external apparatus, or may store the information in a storage medium.

Figure 2:
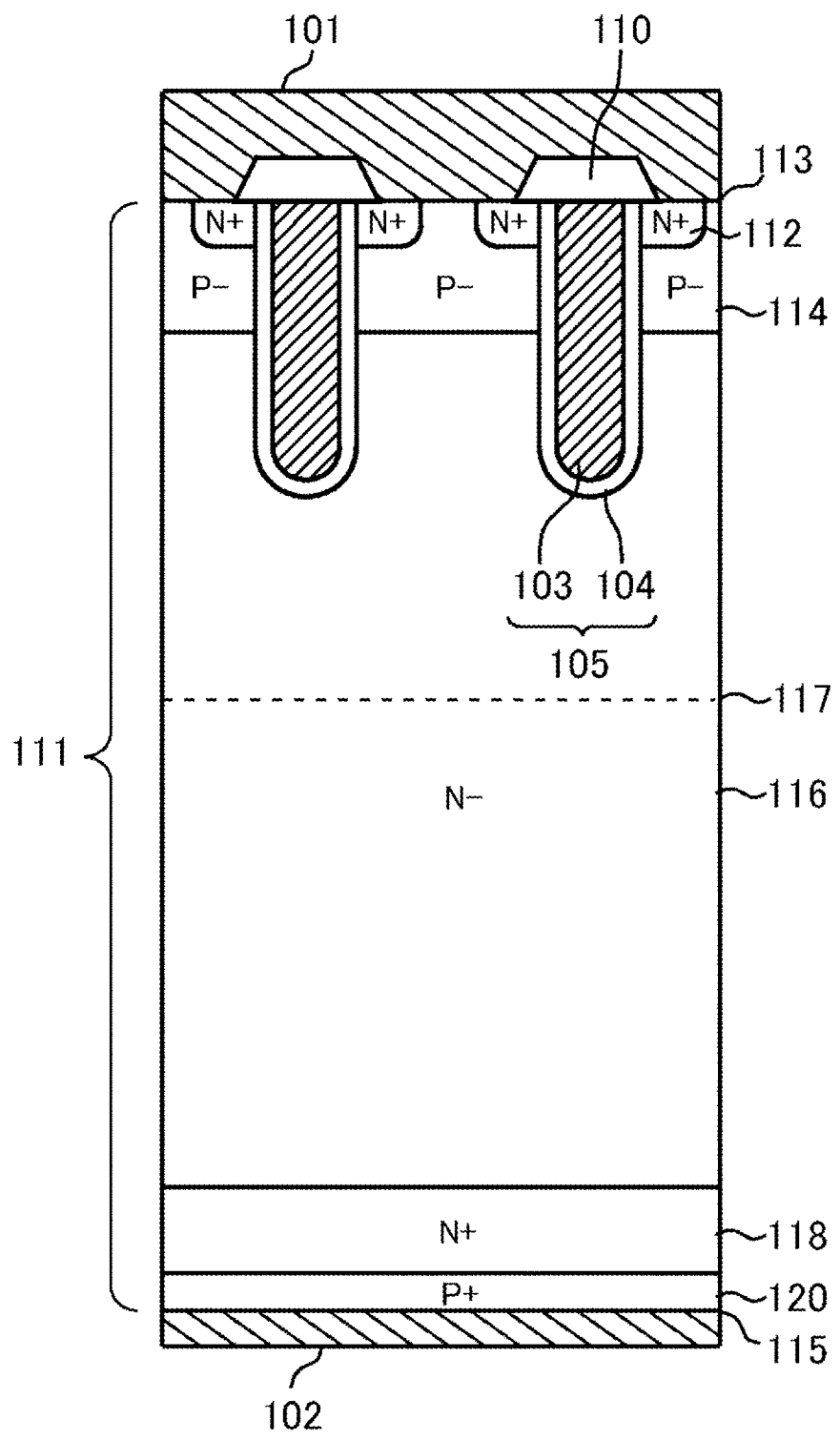
FIG. 2 is a cross-sectional view illustrating an example of a semiconductor device 100 to be analyzed.

FIG. 2 is a cross-sectional view illustrating an example of a semiconductor device 100 to be analyzed. Although the semiconductor device 100 of the present example includes an IGBT, the structure of the semiconductor device 100 is not limited thereto. The semiconductor device 100 includes a semiconductor substrate 111, a first main terminal 101, a second main terminal 102, and an interlayer dielectric film 110. In the present example, the first main terminal 101 is an emitter electrode, and the second main terminal 102 is a collector electrode. The first main terminal 101 and the second main terminal 102 are formed of a metal material such as aluminum.

The semiconductor substrate 111 is a substrate formed of a semiconductor material such as silicon or of a compound semiconductor material such as silicon carbide or gallium arsenide. The semiconductor substrate 111 may have a wafer shape including a plurality of chips, or may have a singulated chip shape. The semiconductor substrate 111 has an upper surface 113 and a lower surface 115. Although the semiconductor device 100 of the present example is a vertical device in which the first main terminal 101 is provided on the upper surface 113 and the second main terminal 102 is provided on the lower surface 115, the semiconductor device 100 may be a horizontal device in which the first main terminal 101 and the second main terminal 102 are provided on the same surface.

The semiconductor substrate 111 of the present example includes a gate structure portion 105, an emitter region 112, a base region 114, a drift region 116, a buffer region 118, and a collector region 120. The drift region 116 is a region of an N− type. The emitter region 112 is disposed between the drift region 116 and the upper surface 113. The emitter region 112 is a contact region of an N+ type in direct contact with the first main terminal 101. The base region 114 is a contact region of a P− type in direct contact with the first main terminal 101. At least a part of the base region 114 is disposed between the emitter region 112 and the drift region 116.

The collector region 120 is a region of a P+ type provided in direct contact with the lower surface 115. The collector region 120 is electrically connected to the second main terminal 102. The buffer region 118 is a region of the N+ type provided between the collector region 120 and the drift region 116. The buffer region 118 functions as a field stop layer that prevents a depletion layer 117 spreading from the upper surface 113 side from reaching the collector region 120.

The gate structure portion 105 is provided at a position facing the base region 114 located between the emitter region 112 and the drift region 116. The gate structure portion 105 of the present example is of a trench type provided from the upper surface 113 of the semiconductor substrate 111 to the drift region 116, passing through the emitter region 112 and the base region 114. The gate structure portion 105 of another example may be of a planner type provided above the upper surface 113 of the semiconductor substrate 111. The gate structure portion 105 is insulated from the first main terminal 101 by the interlayer dielectric film 110.

The gate structure portion 105 includes a gate dielectric film 104 and a control terminal 103. The control terminal 103 in the present example is a gate electrode. The control terminal 103 may be formed of a conductive material such as polysilicon. The control terminal 103 is provided so as to face at least the base region 114. The gate dielectric film 104 may be a film formed by thermally oxidizing or thermally nitriding the semiconductor substrate 111. The gate dielectric film 104 insulates the control terminal 103 from the semiconductor substrate 111. Applying a predetermined control voltage to the control terminal 103 causes a channel region of the N type to be formed in the surface layer of the base region 114 in direct contact with the gate dielectric film 104. This causes the emitter region 112 and the drift region 116 to be connected by a channel region, and thus a current flows. In the present specification, a state in which the channel region is formed in the base region 114 may be referred to as an ON state, and a state in which the channel region is not formed may be referred to as an OFF state.

Figure 3:
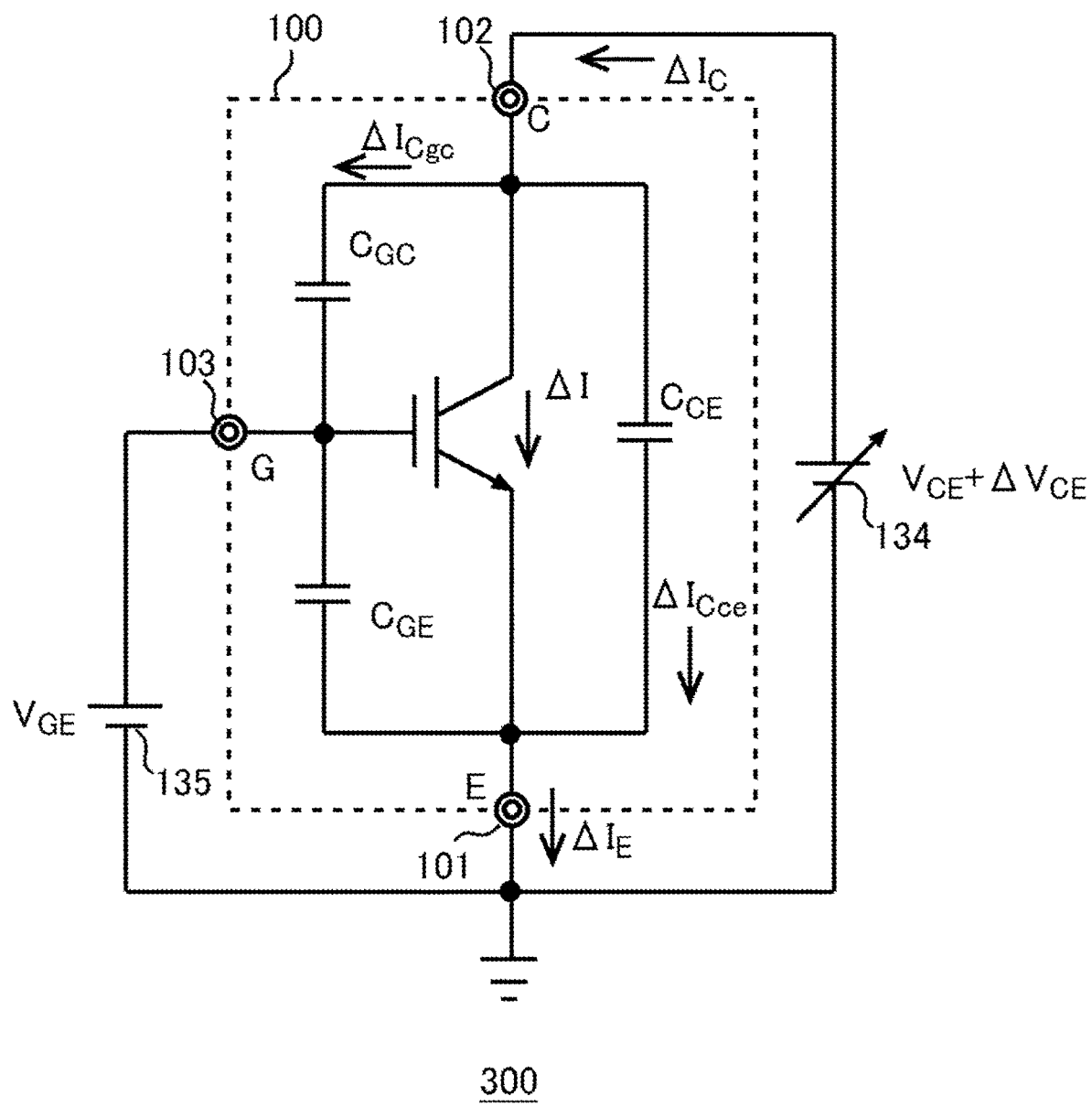
FIG. 3 is an example of a circuit 300 schematically illustrating the semiconductor device 100.

FIG. 3 is an example of a circuit 300 schematically illustrating the semiconductor device 100. The analyzing apparatus 10 may analyze the operation of the semiconductor device 100 by using the circuit 300. A control voltage $V_{GE}$ is applied from a power source 135 to the control terminal 103. The first main terminal 101 is connected to a reference potential such as a ground potential. A power source voltage $V_{CE}$ is applied from a power source 134 between the first main terminal 101 and the second main terminal 102. The charge amount analyzing unit 14 may set the control voltage $V_{GE}$ and the power source voltage $V_{CE}$ and analyze the charge amount in the semiconductor device 100.

A capacitance between the first main terminal 101 and the second main terminal 102 of the semiconductor device 100 is referred to as an inter-terminal capacitance $C_{CE}$. Similarly, the capacitance between the first main terminal 101 and the control terminal 103 is referred to as an inter-terminal capacitance $C_{GE}$, and the capacitance between the second main terminal 102 and the control terminal 103 is referred to as an inter-terminal capacitance $C_{GC}$. The capacitance calculating unit 16 is configured to calculate an inter-terminal capacitance C as any one of the inter-terminal capacitances. The inter-terminal capacitance $C_{GC}$ of the semiconductor device has a value that may be different depending on whether the semiconductor device is in the ON state or the OFF state. When the semiconductor device is in the ON state, it is difficult to precisely measure or calculate the inter-terminal capacitance $C_{GC}$ if a current density is large. An example will be described below in which the inter-terminal capacitance $C_{GC}$ is precisely calculated even when the semiconductor device is in the ON state.

Figure 4:
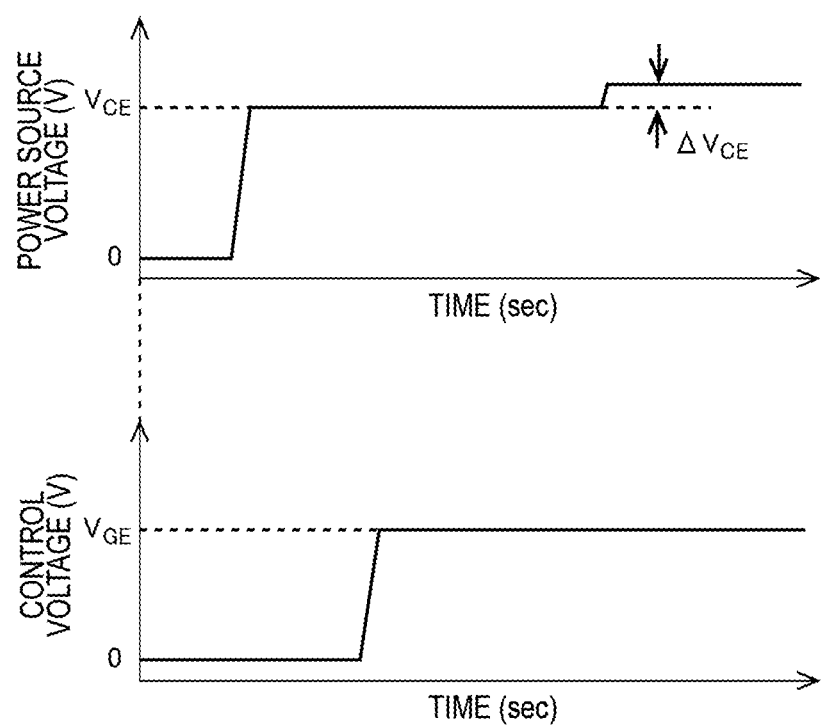
FIG. 4 is a diagram for explaining an operation example of a charge amount analyzing unit 14.

FIG. 4 is a diagram for explaining an operation example of the charge amount analyzing unit 14. The charge amount analyzing unit 14 is configured to set the control voltage $V_{GE}$ so that the semiconductor device 100 is in the ON state. That is, the charge amount analyzing unit 14 is configured to set the control voltage $V_{GE}$ higher than the threshold voltage of the semiconductor device 100. In addition, the charge amount analyzing unit 14 is configured to set the power source voltage $V_{CE}$ to a predetermined initial value. Then, the charge amount analyzing unit 14 is configured to calculate a change of the charge amount of the first main terminal 101 when the power source voltage $V_{CE}$ is changed by a displacement voltage $\Delta V_{CE}$ after a current $I_{CE}$ between a collector electrode C and an emitter electrode E becomes constant. The displacement voltage $\Delta V_{CE}$ is sufficiently smaller than the power source voltage $V_{CE}$. The displacement voltage $\Delta V_{CE}$ may be, for example, 10% or less, 1% or less, or 0.1% or less of the power source voltage $V_{CE}$. The state in which the current $I_{CE}$ between the collector electrode C and the emitter electrode E is constant may be, for example, a state in which the current $I_{CE}$ between the collector electrode C and the emitter electrode E is substantially unchanged with time at a constant current value, and may be a state in which the current flowing through the control terminal 103 is substantially zero. The expression "substantially unchanged" may mean, for example, that a variation range is 20% or less of an average value. Since the control voltage $V_{GE}$ is unchanged, the inter-terminal capacitance $C_{GE}$ is unchanged. Therefore, the displacement current due to a small change $\Delta V_{CE}$ in the power source voltage $V_{CE}$ is due only to the inter-terminal capacitance $C_{GC}$. The inter-terminal capacitance $C_{GC}$ may be calculated by, for example, computing the amount of change $\Delta Q_{GC}$ in charge between the electrodes G and C from the space charge density between the gate oxide film and the drift region, and dividing the same by the amount of change $\Delta V_{CE}$ in voltage between the electrodes C and E ($\Delta Q_{GC}/\Delta V_{CE}$).

The charge amount analyzing unit 14 may set the magnitude of the displacement voltage $\Delta V_{CE}$ depending on the change of the magnitude of the power source voltage $V_{CE}$. For example, the displacement voltage $\Delta V_{CE}$ may be a voltage obtained by multiplying the power source voltage $V_{CE}$ by a predetermined coefficient. In another example, the displacement voltage $\Delta V_{CE}$ may be a constant voltage regardless of the change of the power source voltage $V_{CE}$.

The charge amount of the terminal may be a charge amount of a contact region in direct contact with the terminal in the semiconductor substrate 111. For example, the charge amount of the second main terminal 102 includes the charge amount of the collector region 120 in direct contact with the second main terminal 102. The charge amount of the first main terminal 101 includes the charge amount of the emitter region 112 and the base region 114 that are in direct contact with the first main terminal 101.

The charge amount analyzing unit 14 may calculate the charge amount of the collector region 120 using Poisson's equation expressed by the following Expression.

$$\nabla^2 \cdot \varphi = -q(p-n+N_D-N_A)/\varepsilon$$

Where, $\nabla$ is a differential operator, $\varphi$ is an electrostatic potential, q is an elementary charge amount, p is a hole density, n is an electron density, $N_D$ is a donor concentration, $N_A$ is an acceptor concentration, and $\varepsilon$ is a dielectric constant of the semiconductor substrate 111. The dielectric constant $\varepsilon$ of the semiconductor substrate 111 is a value obtained by multiplying a vacuum dielectric constant $\varepsilon_0$ by a relative dielectric constant $\varepsilon_r$ of the semiconductor substrate 111. The mathematical term $p-n+N_D-N_A$ corresponds to the charge density.

The dielectric constant $\varepsilon$ may be given to the charge amount analyzing unit 14 as an analysis condition. The electrostatic potential $\varphi$ at each position of the semiconductor region depends on the power source voltage $V_{CE}$. For each position, the charge amount analyzing unit 14 is configured to calculate, according to the above-described Poisson's equation, the charge density when the power source voltage is $V_{CE}$ and the charge density when the power source voltage is $V_{CE}+\Delta V_{CE}$. In the charge amount analyzing unit 14, the donor concentration $N_D$ and the acceptor concentration $N_A$ at each position of the semiconductor substrate 111 may be set in advance as analysis conditions.

The charge amount analyzing unit 14 is configured to compute the sum of the charge densities of the collector region 120. The charge amount analyzing unit 14 may integrate the above-described charge density. The charge amount can be calculated by multiplying the integrated value of the charge density by the elementary charge. The charge amount analyzing unit 14 may calculate the temporal change of the charge amount when the power source voltage is changed as illustrated in FIG. 4 by transient analysis (that derives a solution from a differential equation formed based on Kirchhoff's law). The charge amount analyzing unit 14 may calculate the charge amount when the change of the charge amount converges as the charge amount when the power source voltage is $V_{CE}+\Delta V_{CE}$. The charge amount analyzing unit 14 may calculate a difference $\Delta Q$ between the charge amount when the power source voltage is $V_{CE}$ and the charge amount when the power source voltage is $V_{CE}+\Delta V_{CE}$.

The charge amount analyzing unit 14 may further calculate the charge density in at least a part of the drift region 116. Similarly to the collector region 120, the charge density of the drift region 116 can also be analyzed from the power source voltage $V_{CE}$ and the displacement voltage $\Delta V_{CE}$ using Poisson's equation. For example, the charge amount analyzing unit 14 may calculate the charge density of the drift region 116 in a range where the depletion layer 117 spreads when the power source voltage $V_{CE}$ is applied. The charge amount analyzing unit 14 may calculate the charge amount of the region by integrating the charge density of the region of the drift region 116. The charge amount analyzing unit 14 may include the charge amount of the region in the charge amount of the second main terminal 102. Since the inter-terminal capacitance $C_{GC}$ can change depending on how the depletion layer 117 spreads, the inter-terminal capacitance $C_{GC}$ can be analyzed more precisely by considering the charge amount in the region.

The capacitance calculating unit 16 calculates the inter-terminal capacitance $C_{GC}$ based on the difference $\Delta Q$ of the charge amount, which is calculated by the charge amount analyzing unit 14, and the displacement voltage $\Delta V_{CE}$. The capacitance calculating unit 16 may calculate the inter-terminal capacitance $C_{GC}$ by the following Expression.

$$C_{GC} = \Delta Q / \Delta V_{CE}$$

Figure 5:
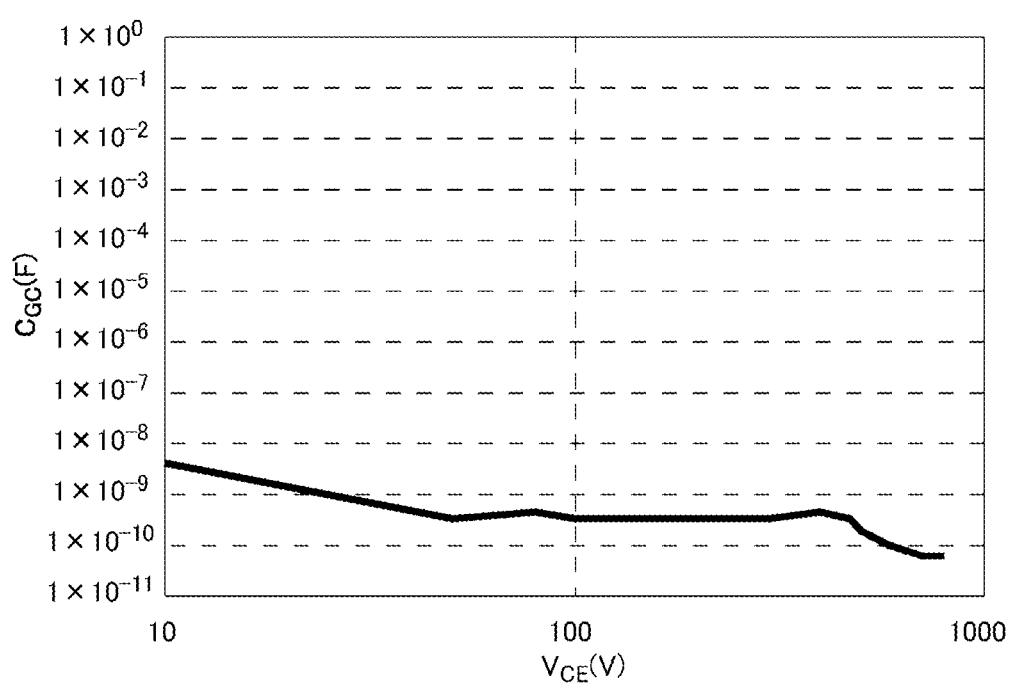
FIG. 5 is a diagram illustrating an example of a C-V characteristic calculated by a capacitance calculating unit 16.

FIG. 5 is a diagram illustrating an example of the C-V characteristic calculated by the capacitance calculating unit 16. In the present example, the charge amount analyzing unit 14 changes the power source voltage $V_{CE}$ from the initial voltage, and analyzes, for each of the changed power source voltages $V_{CE}$, the change $\Delta Q$ of the charge amount when the power source voltage $V_{CE}$ is changed by the displacement voltage $\Delta V_{CE}$. For example, the charge amount analyzing unit 14 changes the power source voltage $V_{CE}$ to 10 V, 50 V, 100 V, 500 V, and so on, and calculates the change $\Delta Q$ of the charge amount when the power source voltage $V_{CE}$ is changed by the displacement voltage $\Delta V_{CE}$ with respect to each power source voltage $V_{CE}$.

The capacitance calculating unit 16 calculates the inter-terminal capacitance $C_{GC}$ for each of the power source voltages $V_{CE}$ based on the change $\Delta Q$ of the charge amount analyzed for each power source voltage $V_{CE}$. As a result, the C-V characteristic as illustrated in FIG. 5 is obtained. The capacitance calculating unit 16 may set the calculated inter-terminal capacitance $C_{GC}$ as a capacitance value at the power source voltage $V_{CE}$. That is, the calculated inter-terminal capacitance $C_{GC}$ may be a capacitance value at the power source voltage $V_{CE}$ before change. In another example, the capacitance calculating unit 16 may set the calculated inter-terminal capacitance $C_{GC}$ as a capacitance value with respect to the power source voltage $V_{CE} + \Delta V_{CE}$. That is, the calculated inter-terminal capacitance $C_{GC}$ may be a capacitance value with respect to the power source voltage $V_{CE} + \Delta V_{CE}$ after the power source voltage $V_{CE}$ is changed by the displacement voltage $\Delta V_{CE}$. The capacitance calculating unit 16 may set the calculated inter-terminal capacitance $C_{GC}$ as a capacitance value with respect to the power source voltage $V_{CE} + 0.5 \times \Delta V_{CE}$. That is, the calculated inter-terminal capacitance $C_{GC}$ may be a capacitance value with respect to the average power source voltage before and after change.

Figure 6:
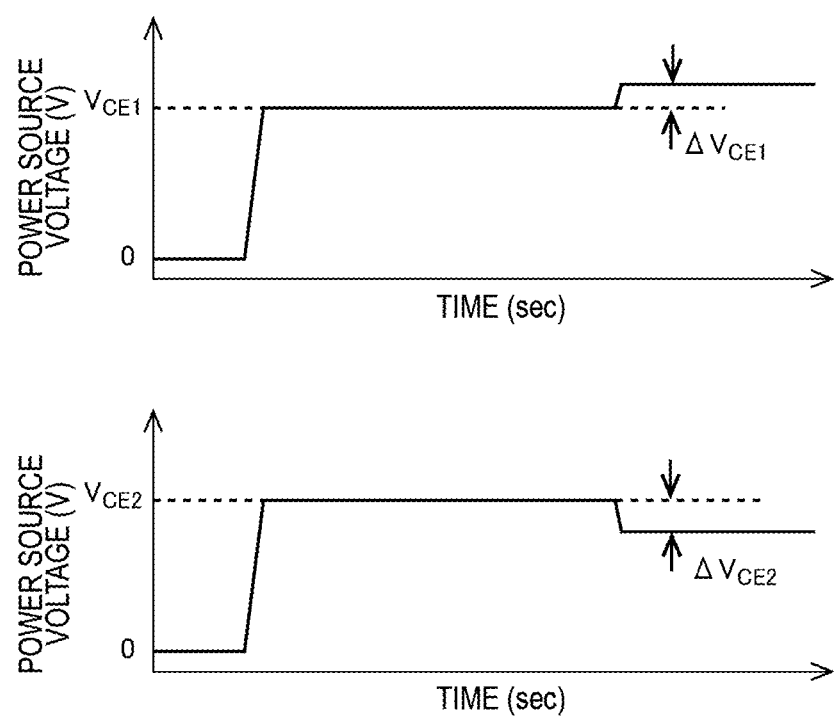
FIG. 6 is a diagram illustrating another operation example of the charge amount analyzing unit 14.

FIG. 6 is a diagram illustrating another operation example of the charge amount analyzing unit 14. The charge amount analyzing unit 14 of the present example analyzes a first change $\Delta Q1$ in the charge amount when a first displacement voltage $\Delta V_{CE1}$ is added to a first power source voltage $V_{CE1}$ and a second change $\Delta Q2$ in the charge amount when a second displacement voltage $\Delta V_{CE2}$ is subtracted from a second power source voltage $V_{CE2}$.

The first power source voltage $V_{CE1}$ and the second power source voltage $V_{CE2}$ may be the same voltage. That is, the voltages may be set such that the power source voltages before change become the same. The charge amount analyzing unit 14 may calculate the change $\Delta Q1$ of the charge amount when the voltage is increased from the power source voltage $V_{CE}$ and the change $\Delta Q2$ of the charge amount when the voltage is decreased from the same power source voltage $V_{CE}$. The first displacement voltage $\Delta V_{CE1}$ and the second displacement voltage $\Delta V_{CE2}$ may be the same or different. The charge amount analyzing unit 14 may calculate a weighted average of $\Delta Q1$ and $\Delta Q2$ depending on the ratio between the first displacement voltage $\Delta V_{CE1}$ and the second displacement voltage $\Delta V_{CE2}$. In this case, the capacitance calculating unit 16 may set the inter-terminal capacitance $C_{GC}$ calculated from the average value $\Delta Q$ of the change of the charge amount as the capacitance with respect to the power source voltage $V_{CE}$. Even in this case, the C-V characteristic illustrated in FIG. 5 can be obtained by changing each power source voltage from the initial value.

In another example, the first power source voltage $V_{CE1}$ and the second power source voltage $V_{CE2}$ may be different voltages. For example, the voltages may be set such that the voltage $V_{CE1} + \Delta V_{CE1}$ obtained by adding the first displacement voltage $\Delta V_{CE1}$ to the first power source voltage $V_{CE1}$ is equal to the voltage $V_{CE2} + \Delta V_{CE2}$ obtained by subtracting the second displacement voltage $\Delta V_{CE2}$ from the second power source voltage $V_{CE2}$. That is, the voltages may be set such that the power source voltages after change become the same. The first displacement voltage $\Delta V_{CE1}$ and the second displacement voltage $\Delta V_{CE2}$ may be the same or different. The charge amount analyzing unit 14 may calculate the change $\Delta Q1$ in the charge amount when the first displacement voltage $\Delta V_{CE1}$ is added to the first power source voltage $V_{CE1}$ and the change $\Delta Q2$ in the charge amount when the second displacement voltage $\Delta V_{CE2}$ is subtracted from the second power source voltage $V_{CE2}$. The capacitance calculating unit 16 may set the inter-terminal capacitance $C_{GC}$ calculated from the average value of the changes $\Delta Q1$ and $\Delta Q2$ of the charge amount as the capacitance with respect to the voltage $V_{CE1} + \Delta V_{CE1}$ ($= V_{CE2} + \Delta V_{CE2}$). Even in this case, the C-V characteristic illustrated in FIG. 5 can be obtained by changing each power source voltage from the initial value.

The device simulator of the charge amount analyzing unit 14 may have a convergence determination function of determining whether the processing of analyzing the change of the charge amount converges. The convergence determination function may determine that the analysis processing does not converge when the charge amount after changing the power source voltage $V_{CE}$ by the displacement voltage $\Delta V_{CE}$ cannot be calculated within a set calculation period or less than or equal to a set calculation processing amount. When the displacement voltage $\Delta V_{CE}$ is reduced, the analysis processing is less likely to converge. On the other hand, as the displacement voltage $\Delta V_{CE}$ is smaller, the C-V characteristic can be analyzed with higher precision. The charge amount analyzing unit 14 may set the displacement voltage to be as small as possible within a range where it is determined that the analysis processing converges. The charge amount analyzing unit 14 may set the smallest displacement voltage in the range where it is determined that the analysis processing converges. The set displacement voltage may have a predetermined margin with respect to the minimum displacement voltage satisfying the condition. By setting the displacement voltage as small as possible, the C-V characteristic can be analyzed with higher precision.

Figure 7:
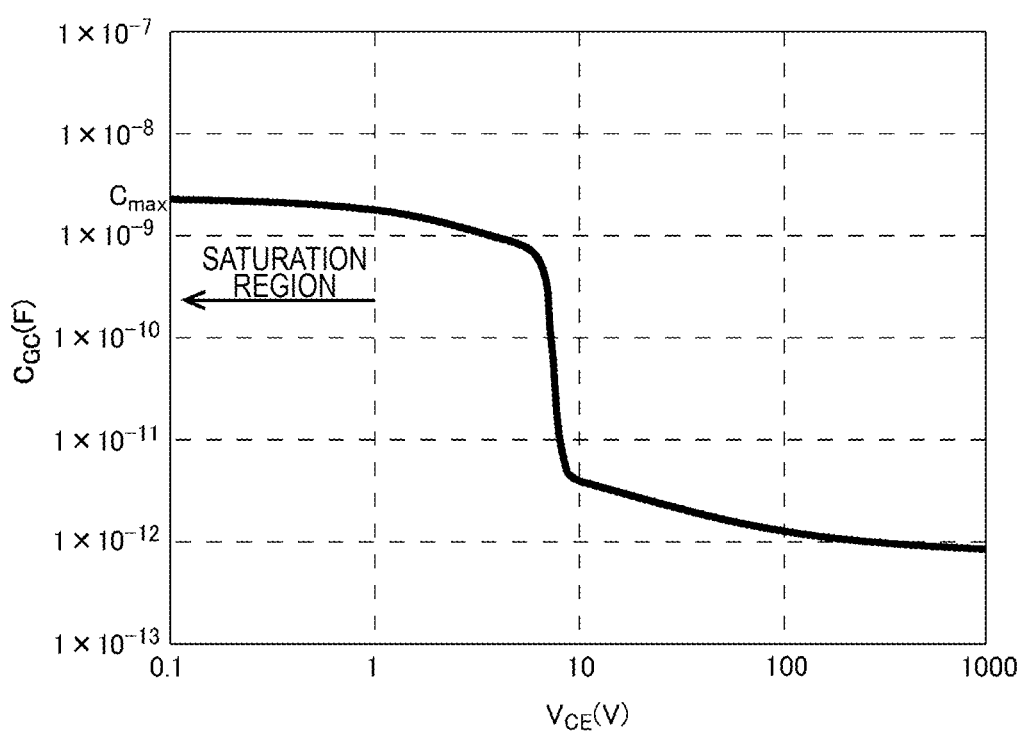
FIG. 7 is a diagram illustrating an example of a general C-V characteristic.

FIG. 7 is a diagram illustrating an example of a general C-V characteristic. In FIG. 7, the horizontal axis represents $V_{CE}$, and the vertical axis represents $C_{GC}$. The capacitance $C_{GC}$ may start to saturate when the power source voltage $V_{CE}$ falls below a predetermined saturation voltage. A voltage at which the capacitance $C_{GC}$ becomes half of a maximum value $C_{max}$ when the power source voltage $V_{GE}$ is lowered may be set as the saturation voltage. In the example of FIG. 7, the saturation voltage is about 1 V.

A region where the capacitance $C_{GC}$ is saturated in the vicinity of the maximum value $C_{max}$ corresponds to a region where the depletion layer does not spread in the OFF state of the semiconductor device 100. Since the analyzing apparatus 10 analyzes the C-V characteristic of the semiconductor device 100 in the ON state, the charge amount analyzing unit 14 may set the lower limit voltage of the variation range of the power source voltage $V_{CE}$ depending on the saturation voltage. The lower limit voltage may be a saturation voltage.

The charge amount analyzing unit 14 may determine the displacement voltage $\Delta V_{CE}$ depending on the saturation voltage. The charge amount analyzing unit 14 may determine the displacement voltage $\Delta V_{CE}$ by multiplying the saturation voltage by a predetermined coefficient. The coefficient may be, for example, 0.2 or less, 0.1 or less, or 0.01 or less. As a result, it is possible to set a sufficiently small displacement voltage $\Delta V_{CE}$ with respect to the lower limit of the variation range of the power source voltage $V_{CE}$ to be measured. The saturation voltage may be set in advance by a user or the like, and may be analyzed by the charge amount analyzing unit 14 based on input information. The saturation voltage may be calculated by analyzing the C-V characteristic when the semiconductor device 100 is in the OFF state.

Figure 8:
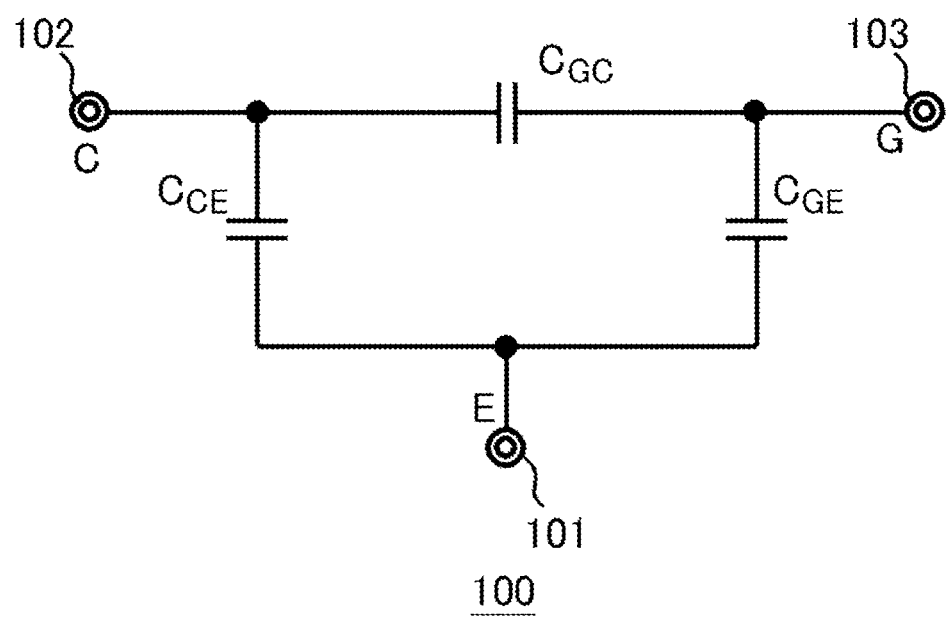
FIG. 8 is a diagram for explaining a measurement method according to a reference example.

FIG. 8 is a diagram for explaining a measurement method according to a reference example. In the measurement method of the present example, a small signal voltage is applied to the semiconductor device 100, a current flowing through the semiconductor device 100 is measured, and impedance is computed to measure the C-V characteristic. FIG. 8 is an equivalent circuit illustrating only a capacitance component of the semiconductor device 100. In the reference example, an alternating small signal voltage is applied to the capacitance C of which the C-V characteristic is to be measured to measure a flowing current.

Figure 9:
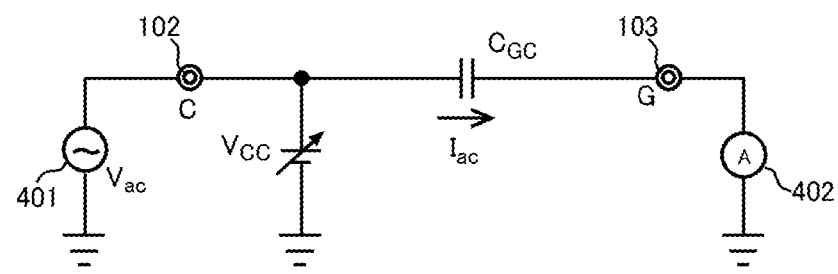
FIG. 9 is a diagram illustrating an example of a measurement circuit 405.

FIG. 9 is a diagram illustrating an example of a measurement circuit 405 used in the reference example. In the present example, an example of measuring the capacitance $C_{GC}$ is shown, but other capacitances C can also be measured in the same manner. In the case of measuring the capacitance $C_{GC}$, the first main terminal 101 illustrated in FIG. 8 is connected to the ground potential via an AC guard that allows an AC signal to pass therethrough. As a result, the impedance of the capacitance $C_{GC}$ can be measured excluding the capacitance $C_{GE}$ and the capacitance $C_{CE}$.

In the present example, a small signal source 401 and the power source $V_{CC}$ are connected in parallel to the second main terminal 102. A voltage of $V=V_{CC}+V_{ac}$ is applied to the capacitance $C_{GC}$. An ammeter 402 is connected to the control terminal 103. The capacitance $C_{GC}$ can be calculated as in the following Expression based on the current I measured by the ammeter 402 and the applied voltage V. $C_{GC}=I/j\omega V$ The C-V characteristic can be acquired by changing the power source voltage $V_{CC}$ and measuring the capacitance $C_{GC}$. The information on the saturation voltage described in FIG. 7 may be acquired from the measurement result of the reference example.

Figure 10:
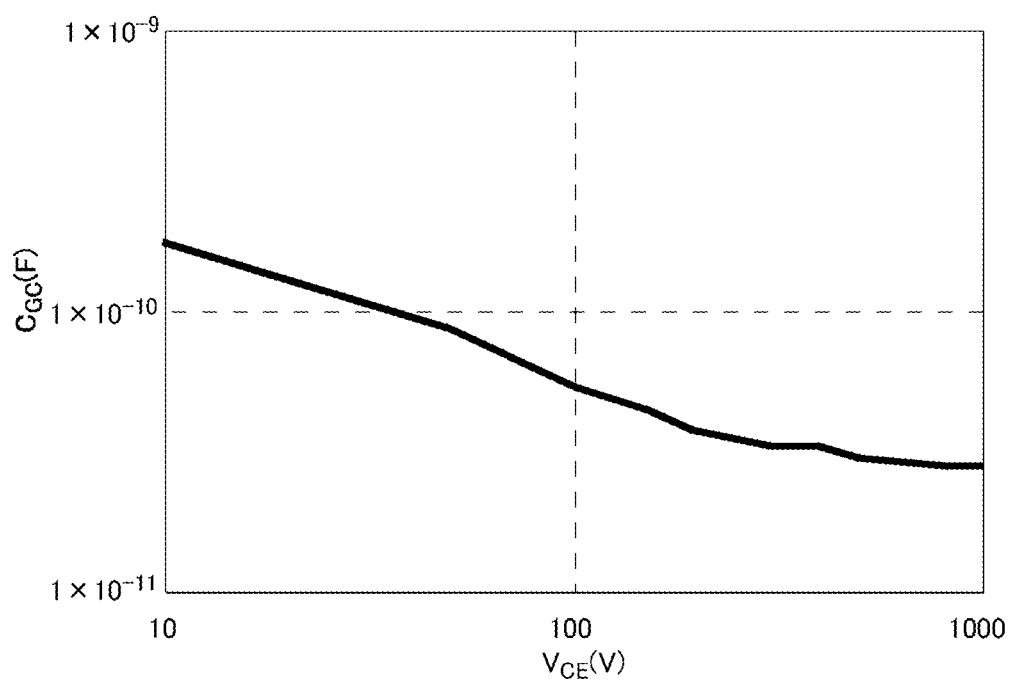
FIG. 10 is a diagram illustrating an example of the C-V characteristic calculated based on the measurement circuit 405 illustrated in FIG. 9.

FIG. 10 is a diagram illustrating an example of the C-V characteristic calculated based on the measurement circuit 405 illustrated in FIG. 9. In FIG. 10, substantially appropriate C-V characteristics are obtained. However, as described above, the C-V characteristic is a characteristic when the semiconductor device 100 is in the OFF state. However, the C-V characteristic of the semiconductor device 100 may change when the semiconductor device 100 is in the ON state and when the semiconductor device is in the OFF state. The semiconductor device 100 may be often used in the ON state. Therefore, it is preferable that the C-V characteristic in the ON state of the semiconductor device 100 can be analyzed.

Figure 11:
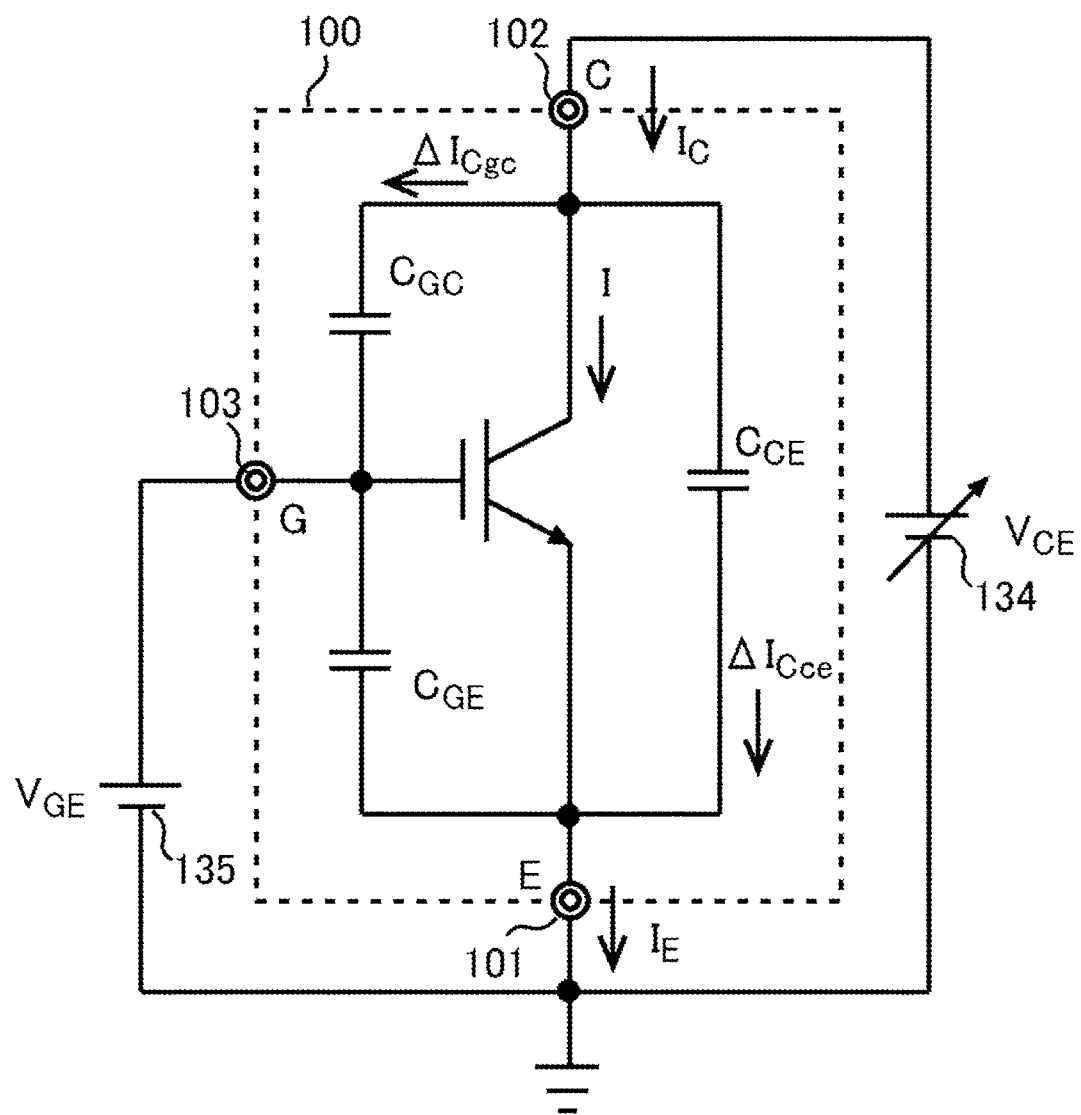
FIG. 11 illustrates a circuit 420 showing an operation when the semiconductor device 100 is in an ON state in a reference example.

FIG. 11 illustrates a circuit 420 showing an operation when the semiconductor device 100 is in the ON state in the reference example. In the circuit 420, the small signal source 401 is omitted. The circuit 420 analyzes the operation of the DC component.

As illustrated in FIG. 11, when the semiconductor device 100 is in the ON state, the current $I_C$ flowing through the second main terminal 102 includes the main current I. Normally, the main current I is much larger than the current flowing through each capacitance when the power source voltage $V_{CE}$ changes.

In such a case, when the inter-terminal capacitance $C_{GC}$ is analyzed using the equivalent circuit as illustrated in FIG. 9, the current $I_{ac}$ includes a component of the main current I in addition to the current flowing through each capacitance. Therefore, the apparent current amount becomes very large, and the inter-terminal capacitance $C_{GC}$ becomes a very large value.

Figure 12:
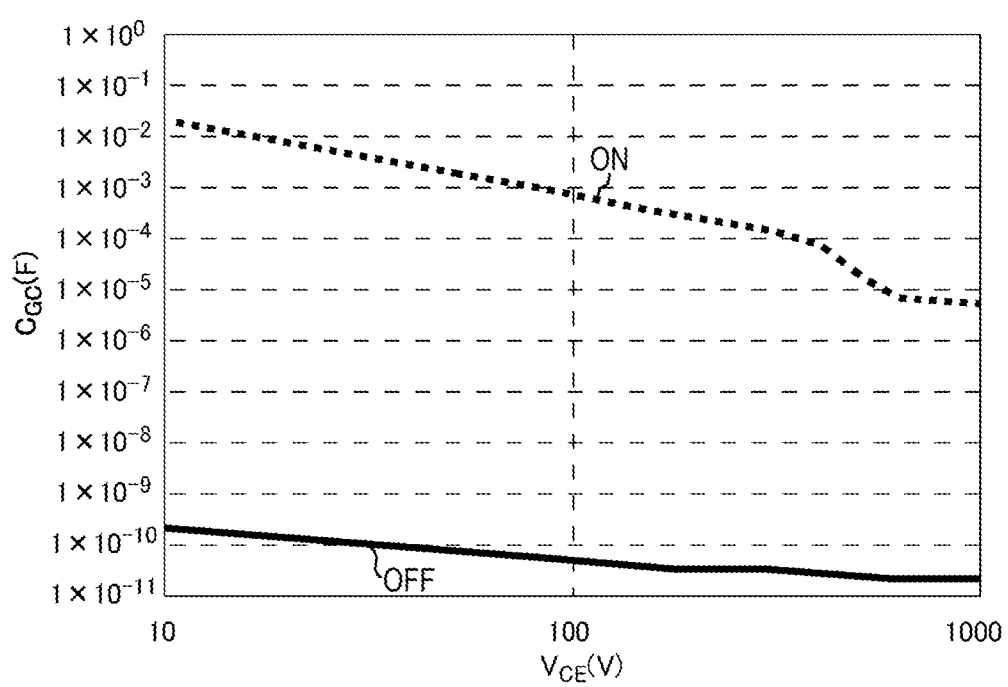
FIG. 12 illustrates an analysis value of a capacitance $C_{GC}$ when the semiconductor device 100 is in the ON state and an analysis value of the capacitance $C_{GC}$ when the semiconductor device is in the OFF state.

FIG. 12 illustrates an analysis value of the inter-terminal capacitance $C_{GC}$ when the semiconductor device 100 is in the ON state and an analysis value of the inter-terminal capacitance $C_{GC}$ when the semiconductor device is in the OFF state. As illustrated in FIG. 12, the analysis value of the inter-terminal capacitance $C_{GC}$ in the ON state is much larger than the analysis value of the inter-terminal capacitance $C_{GC}$ in the OFF state. In this way, the analysis method of the reference example cannot precisely analyze the capacitance when the semiconductor device 100 is in the ON state.

Figure 13:
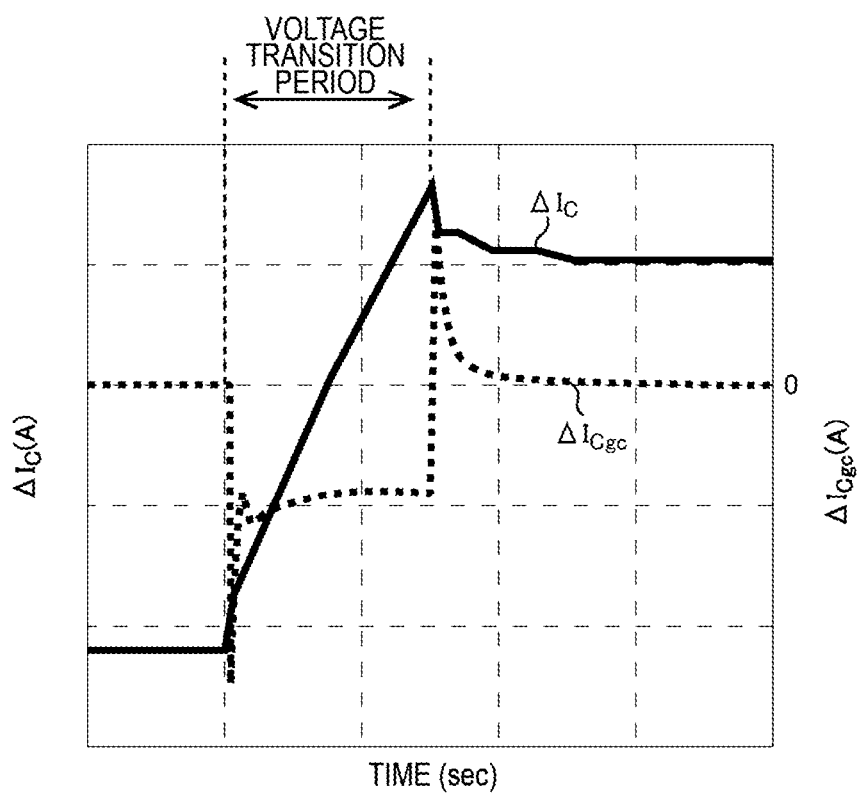
FIG. 13 is a diagram in which each current waveform is analyzed from the charge amount calculated by the analysis method described in FIG. 1 to FIG. 6.

FIG. 13 is a diagram in which each current waveform is analyzed from the charge amount calculated by the analysis method described in FIG. 1 to FIG. 6. In FIG. 13, a period during which the power source voltage is changed from $V_{CE}$ to $V_{CE}+\Delta V_{CE}$ is defined as a voltage transition period. FIG. 13 illustrates a change $\Delta I_c$ of the collector current flowing through the second main terminal 102 shown in FIG. 3 and a change $\Delta I_{Cgc}$ of the current flowing through the inter-terminal capacitance $C_{GC}$. The change $\Delta I_c$ is a difference of the current $I_c$ when the power source voltage is changed. The change $\Delta I_{Cgc}$ can be calculated from the integrated value of the charges in the collector region 120.

As illustrated in FIG. 13, when the power source voltage is increased, the collector current $I_C$ increases as the main current increases. On the other hand, the current $I_{Cgc}$ flowing through the inter-terminal capacitance $C_{GC}$ varies in the voltage transition period, but is substantially zero in periods other than the voltage transition period. As illustrated in FIG. 13, the charge amount calculated by the analysis method described in FIG. 1 to FIG. 6 does not include the charges contributing to the collector current $I_C$. Therefore, the C-V characteristic in the ON state of the semiconductor device 100 can be precisely analyzed. The C-V characteristic in the ON state illustrated in FIG. 5 has a small difference from the C-V characteristic in the OFF state illustrated in FIG. 12, and is a substantially appropriate value. Since the charges calculated in the analysis method does not include the charges contributing to the collector current $I_C$, the inter-terminal capacitance $C_{GC}$ can be computed without affecting the collector current $I_C$.

Figure 14:
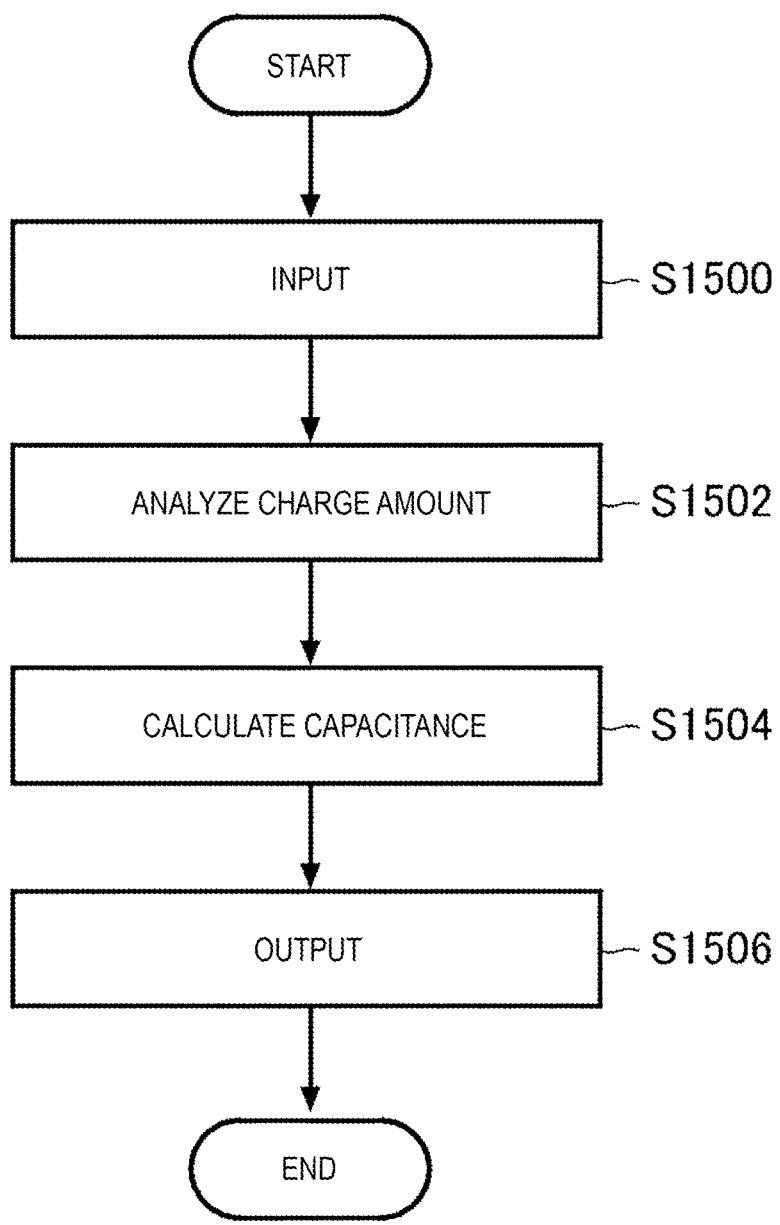
FIG. 14 is a flowchart illustrating an example of an analysis method using the analyzing apparatus 10 illustrated in FIG. 1 to FIG. 6.

FIG. 14 is a flowchart illustrating an example of an analysis method using the analyzing apparatus 10 illustrated in FIG. 1 to FIG. 6. In the analysis method, each processing described in FIG. 1 to FIG. 6 may be appropriately performed. The analysis method includes an input step S1500, a charge amount analysis step S1502, a capacitance calculation step S1504, and an output step S1506.

The processing in the input step S1500 is similar to the processing of the input unit 12. The processing in the charge amount analysis step S1502 is similar to the processing of the charge amount analyzing unit 14. The processing in the capacitance calculation step S1504 is similar to the processing of the capacitance calculating unit 16. The processing in the output step S1506 is similar to the processing of the output unit 18.

Figure 15:
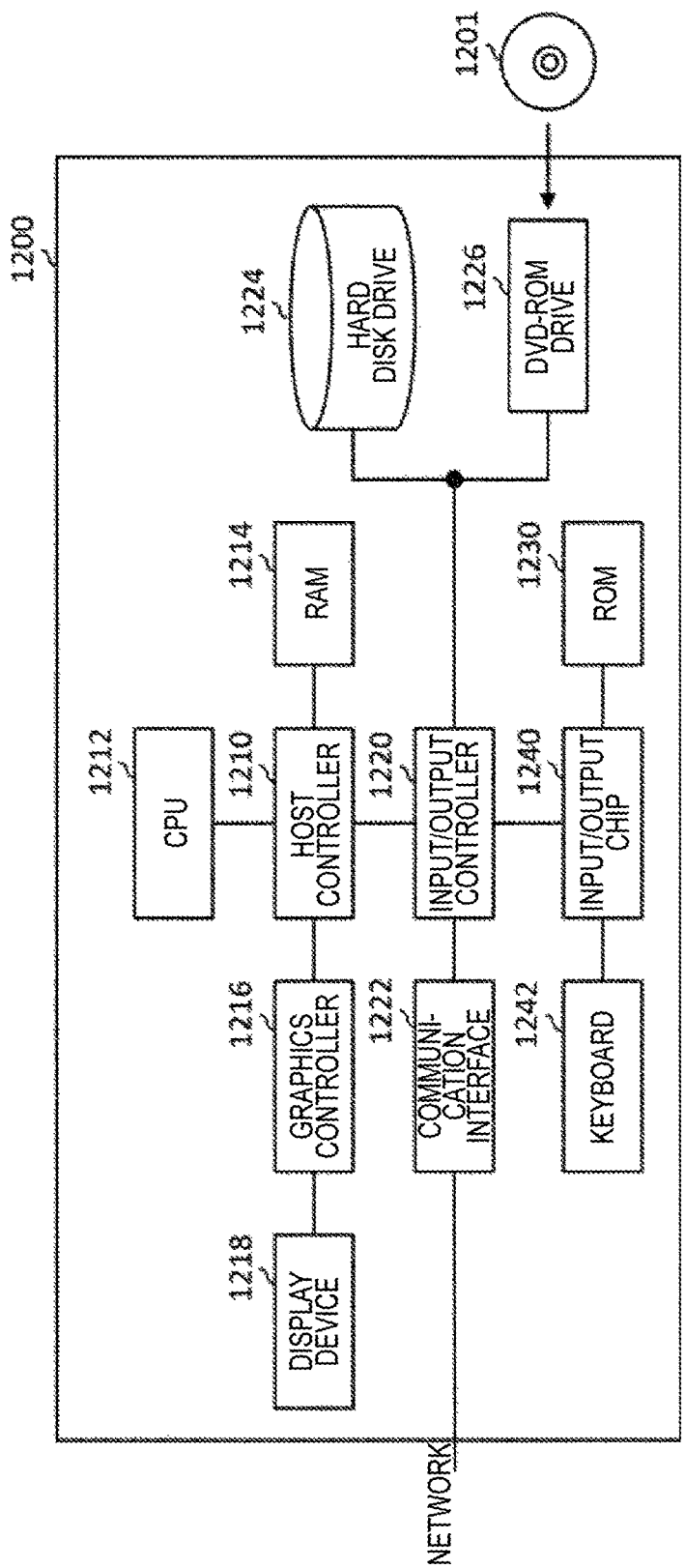
FIG. 15 illustrates a configuration example of a computer 1200 in which a plurality of aspects of the present invention may be embodied in whole or in part.

FIG. 15 illustrates a configuration example of a computer 1200 in which a plurality of aspects of the present invention may be embodied in whole or in part. A program installed in the computer 1200 can cause the computer 1200 to function as an operation associated with the device according to the embodiment of the present invention or one or more "units" of the device, or execute the operation or the one or more "units", and/or cause the computer 1200 to execute a process according to the embodiment of the present invention or a stage of the process. Such programs may be executed by a CPU 1212 to cause the computer 1200 to perform certain operations associated with some or all of the blocks in the flowcharts and block diagrams described in the present specification. The processes according to the embodiments of the present invention or the stages of the processes may be executed on a cloud.

The computer 1200 according to the present embodiment includes the CPU 1212, a RAM 1214, a graphics controller 1216, and a display device 1218, which are interconnected by a host controller 1210. The computer 1200 also includes input/output units such as a communication interface 1222, a hard disk drive 1224, a DVD-ROM drive 1226, and an IC card drive, which are connected to the host controller 1210 via an input/output controller 1220. The computer further includes legacy input/output units such as a ROM 1230 and a keyboard 1242, which are connected to the input/output controller 1220 via an input/output chip 1240.

The CPU 1212 operates according to programs stored in the ROM 1230 and the RAM 1214, thereby controlling each unit. The graphics controller 1216 acquires image data generated by the CPU 1212 in a frame buffer or the like provided in the RAM 1214 or in the graphics controller 1216, such that the image data is displayed on the display device 1218.

The communication interface 1222 communicates with other electronic devices via a network. The hard disk drive 1224 stores programs and data used by the CPU 1212 in the computer 1200. The DVD-ROM drive 1226 reads program or data from the DVD-ROM 1201 and provides the programs or data to the hard disk drive 1224 via the RAM 1214. The IC card drive reads programs and data from the IC card and/or writes the programs and data to the IC card.

The ROM 1230 stores therein a boot program executed by the computer 1200 at the time of activation and/or a program dependent on hardware of the computer 1200. The input/output chip 1240 may also connect various input/output units to the input/output controller 1220 via a parallel port, a serial port, a keyboard port, a mouse port, or the like.

The program is provided by a computer-readable storage medium such as a DVD-ROM 1201 or an IC card. The program is read from a computer-readable storage medium, installed in the hard disk drive 1224, the RAM 1214, or the ROM 1230 that are also examples of the computer-readable storage medium, and executed by the CPU 1212. The information processing described in these programs is read by the computer 1200 and provides cooperation between the programs and various types of hardware resources. The apparatus or method may be configured by implementing operation or processing of information according to the use of the computer 1200.

For example, when communication is performed between the computer 1200 and an external device, the CPU 1212 may execute a communication program loaded in the RAM 1214 and instruct the communication interface 1222 to perform communication processing based on the processing described in the communication program. Under the control of the CPU 1212, the communication interface 1222 reads transmission data stored in a transmission buffer region provided in a recording medium such as the RAM 1214, the hard disk drive 1224, the DVD-ROM 1201, or the IC card, transmits the read transmission data to the network, or writes reception data received from the network in a reception buffer region or the like provided on the recording medium.

In addition, the CPU 1212 may cause the RAM 1214 to read all or a necessary part of a file or database stored in an external recording medium such as the hard disk drive 1224, the DVD-ROM drive 1226 (DVD-ROM 1201), the IC card, or the like, and may execute various types of processing on data on the RAM 1214. Next, the CPU 1212 may write back the processed data to the external recording medium.

Various types of information such as various types of programs, data, tables, and databases may be stored in a recording medium to be subjected to information processing. The CPU 1212 may execute various types of processing on the data read from the RAM 1214, including various types of operations, information processing, conditional determination, conditional branching, unconditional branching, information retrieval/replacement, and the like, which are described throughout the present disclosure and specified by a command sequence of a program, and writes back the results to the RAM 1214. In addition, the CPU 1212 may retrieve information in a file, a database, or the like in the recording medium. For example, when a plurality of entries each having the attribute value of a first attribute associated with the attribute value of a second attribute is stored in the recording medium, the CPU 1212 may retrieve an entry matching the condition in which the attribute value of the first attribute is specified from among the plurality of entries, read the attribute value of the second attribute stored in the entry, and thereby acquire the attribute value of the second attribute associated with the first attribute satisfying the predetermined condition.

The programs or software modules as described above may be stored in a computer-readable storage medium on the computer 1200 or near the computer 1200. In addition, a recording medium such as a hard disk or a RAM provided in a server system connected to a dedicated communication network or the Internet can be used as a computer-readable storage medium, thereby providing a program to the computer 1200 via the network.

While the embodiments of the present invention have been described, the technical scope of the present invention is not limited to the above described embodiments. It is apparent to persons skilled in the art that various alterations or improvements can be added to the above-described embodiments. It is also apparent from the scope of the claims that the embodiments added with such alterations or improvements can be included in the technical scope of the present invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: analyzing apparatus
12: input unit
14: charge amount analyzing unit
16: capacitance calculating unit
18: output unit
100: semiconductor device
101: first main terminal
102: second main terminal
103: control terminal
104: gate dielectric film
105: gate structure portion
110: interlayer dielectric film
111: semiconductor substrate
112: emitter region
113: upper surface
114: base region
115: lower surface
116: drift region
117: depletion layer
118: buffer region
120: collector region
134: power source
135: power source
300: circuit
401: small signal source
402: ammeter
405: measurement circuit
420: circuit
1200: computer
1201: DVD-ROM
1210: host controller
1212: CPU
1214: RAM
1216: graphics controller
1218: display device
1220: input/output controller
1222: communication interface
1224: hard disk drive
1226: DVD-ROM drive
1230: ROM
1240: input/output chip
1242: keyboard

What is claimed is:

1. An analyzing apparatus for analyzing a terminal capacitance of a semiconductor device, the semiconductor device having a control terminal, a first main terminal and a second main terminal and being configured to control, with a voltage applied to the control terminal, a current flowing between the first main terminal and the second main terminal, the analyzing apparatus comprising:

a charge amount analyzing unit configured to analyze, by using a device simulator configured to simulate a transient change of a charge in the semiconductor device, a change of a charge amount at any one of the terminals when a power source voltage applied between the first main terminal and the second main terminal is changed by a displacement voltage smaller than an initial voltage after the current flowing between the first main terminal and the second main terminal is stabilized with the semiconductor device being set to an ON state and the power source voltage being set to the initial voltage; and a capacitance calculating unit configured to compute the terminal capacitance at any one of the terminals based on the change of the charge amount analyzed by the charge amount analyzing unit.

2. The analyzing apparatus according to claim 1, wherein the charge amount analyzing unit is configured to change the power source voltage from the initial voltage and to analyze, for each of the changed power source voltages, the change of the charge amount when the power source voltage is changed by the displacement voltage, and the capacitance calculating unit is configured to calculate the terminal capacitance for each of the power source voltages based on the change of the charge amount analyzed for each of the power source voltages.

3. The analyzing apparatus according to claim 1, wherein the semiconductor device includes a contact region of a p type or an n type in direct contact with the first main terminal or the second main terminal in a semiconductor substrate, and the charge amount analyzing unit is configured to calculate a charge density in the contact region based on the displacement voltage.

4. The analyzing apparatus according to claim 3, wherein the semiconductor device includes a drift region disposed below the contact region in the semiconductor substrate, and the charge amount analyzing unit is further configured to calculate a charge density in at least a part of the drift region based on the displacement voltage.

5. The analyzing apparatus according to claim 1, wherein the charge amount analyzing unit is configured to set a magnitude of the displacement voltage depending on a magnitude of the power source voltage.

6. The analyzing apparatus according to claim 1, wherein the charge amount analyzing unit is configured to set a magnitude of the displacement voltage to a constant value regardless of a magnitude of the power source voltage.

7. The analyzing apparatus according to claim 1, wherein the capacitance calculating unit is configured to calculate the terminal capacitance with respect to a voltage obtained by changing the power source voltage by the displacement voltage.

8. The analyzing apparatus according to claim 1, wherein the charge amount analyzing unit is configured to analyze a first change of the charge amount when a first displacement voltage is added to a first power source voltage and a second change of the charge amount when a second displacement voltage is subtracted from a second power source voltage.

9. The analyzing apparatus according to claim 8, wherein a voltage obtained by adding the first displacement voltage to the first power source voltage is equal to a voltage obtained by subtracting the second displacement voltage from the second power source voltage.

10. The analyzing apparatus according to claim 8, wherein the first power source voltage and the second power source voltage are equal.

11. The analyzing apparatus according to claim 2, wherein the charge amount analyzing unit is configured to analyze a first change of the charge amount when a first displacement voltage is added to a first power source voltage and a second change of the charge amount when a second displacement voltage is subtracted from a second power source voltage.

12. The analyzing apparatus according to claim 3, wherein
the charge amount analyzing unit is configured to analyze a first change of the charge amount when a first displacement voltage is added to a first power source voltage and a second change of the charge amount when a second displacement voltage is subtracted from a second power source voltage.

13. The analyzing apparatus according to claim 4, wherein
the charge amount analyzing unit is configured to analyze a first change of the charge amount when a first displacement voltage is added to a first power source voltage and a second change of the charge amount when a second displacement voltage is subtracted from a second power source voltage.

14. The analyzing apparatus according to claim 5, wherein
the charge amount analyzing unit is configured to analyze a first change of the charge amount when a first displacement voltage is added to a first power source voltage and a second change of the charge amount when a second displacement voltage is subtracted from a second power source voltage.

15. The analyzing apparatus according to claim 6, wherein
the charge amount analyzing unit is configured to analyze a first change of the charge amount when a first displacement voltage is added to a first power source voltage and a second change of the charge amount when a second displacement voltage is subtracted from a second power source voltage.

16. The analyzing apparatus according to claim 7, wherein
the charge amount analyzing unit is configured to analyze a first change of the charge amount when a first displacement voltage is added to a first power source voltage and a second change of the charge amount when a second displacement voltage is subtracted from a second power source voltage.

17. The analyzing apparatus according to claim 11, wherein
a voltage obtained by adding the first displacement voltage to the first power source voltage is equal to a voltage obtained by subtracting the second displacement voltage from the second power source voltage.

18. The analyzing apparatus according to claim 1, wherein
the device simulator includes a convergence determination function of determining whether processing of analyzing the change of the charge amount converges, and
the charge amount analyzing unit is configured to set the displacement voltage which is smallest in a range in which it is determined that the processing of analyzing the change of the charge amount converges.

19. An analysis method of analyzing a terminal capacitance of a semiconductor device, the semiconductor device having a control terminal, a first main terminal and a second main terminal and being configured to control, with a voltage applied to the control terminal, a current flowing between the first main terminal and the second main terminal, the analysis method comprising:
analyzing, by using a device simulator configured to simulate a transient change of a charge in the semiconductor device, a charge amount by analyzing a change of a charge amount at any one of the terminals when a power source voltage applied between the first main terminal and the second main terminal is changed by a displacement voltage smaller than an initial voltage after the current flowing between the first main terminal and the second main terminal is stabilized with the semiconductor device being set to an ON state and the power source voltage being set to the initial voltage; and
calculating a capacitance by computing the terminal capacitance at any one of the terminals based on the change of the charge amount analyzed by the charge amount analyzing unit.

20. A non-transitory computer-readable medium having recorded thereon a program that, when executed by a computer, causes the computer to perform operations comprising:
analyzing, by using a device simulator that is configured to simulate a transient change of a charge in a semiconductor device having a control terminal, a first main terminal and a second main terminal and being configured to control, with a voltage applied to the control terminal, a current flowing between the first main terminal and the second main terminal, a change of a charge amount at any one of the terminals when a power source voltage applied between the first main terminal and the second main terminal is changed by a displacement voltage smaller than an initial voltage after the current flowing between the first main terminal and the second main terminal is stabilized with the semiconductor device being set to an ON state and the power source voltage being set to the initial voltage; and
computing a terminal capacitance of any one of the terminals of the semiconductor device based on the analyzed change of the charge amount.

* * * * *